United States Patent [19]
Nagano et al.

[11] Patent Number: 5,748,288
[45] Date of Patent: May 5, 1998

[54] LIGHTING ASSEMBLY, EXPOSURE APPARATUS AND EXPOSURE METHOD EMPLOYING THE LIGHTING ASSEMBLY

[75] Inventors: Hiroyuki Nagano; Takashi Inoue, both of Osaka; Hiroshi Yamashita; Takeo Sato, both of Kanagawa; Keiji Fujita, Kyoto, all of Japan

[73] Assignee: Matsushita Electric Industrial Co., Ltd., Osaka, Japan

[21] Appl. No.: 613,027

[22] Filed: Mar. 8, 1996

[30] Foreign Application Priority Data

Mar. 8, 1995 [JP] Japan ..................... 7-048865

[51] Int. Cl.$^6$ ............................. G03F 7/20
[52] U.S. Cl. ............................. 355/53; 355/67
[58] Field of Search ............................. 355/53, 67, 68, 355/71, 72, 73

[56] References Cited

U.S. PATENT DOCUMENTS

| | | | |
|---|---|---|---|
| 4,425,038 | 1/1984 | La Fiandra et al. | 355/73 |
| 4,737,824 | 4/1988 | Sakai et al. | 355/53 |
| 4,788,577 | 11/1988 | Akiyama et al. | 355/53 |
| 5,359,388 | 10/1994 | Hollman | 355/53 |

*Primary Examiner*—Joan H. Pendegrass
*Attorney, Agent, or Firm*—Wenderoth, Lind & Ponack

[57] ABSTRACT

The present invention provides spot-illumination of a specific size having sufficiently homogeneous light intensity distribution, with a small and inexpensive apparatus. A lighting assembly condenses the light from light source 1 with condensing-reflecting member 2. An optical integrator 3 receives at its one end the light via condensing-reflecting member 2 and emits from the other end after making the light intensity distribution homogeneous A projection lens system 4 projects the emitting surface of optical integrator 3 onto an emitted surface. By shifting the relative positioning between the lighting assembly and the substrate 11, and adjusting the distance between the substrate 11 and the mask 12, which stores a pattern to be formed, a specified area of the exposure surface 11a is scanned and exposed to have a mask pattern transcribed on the exposure surface 11a.

21 Claims, 3 Drawing Sheets

LIGHTING ASSEMBLY, EXPOSURE APPARATUS AND EXPOSURE METHOD EMPLOYING THE LIGHTING ASSEMBLY

BACKGROUND OF THE INVENTION

The present invention relates to a lighting assembly suitable for exposure processes in the production of semiconductor devices, liquid crystal display devices, etc., and an exposure apparatus and a method employing the lighting assembly.

As an exposure method for the manufacture of semiconductor devices and liquid crystal display devices, the proximity exposure method is well known, and is a close-by exposure. This method provides a glass substrate or a wafer (hereinafter these are referred to simply as substrates) coated with photo resist being held close to a mask; and the mask is then illuminated from above to have a mask pattern transcribed on the photo resist. As compared with the projection exposure method, the proximity exposure method does not use a complicated lens system and/or a high precision stage, which reduces the cost. As compared with the contact exposure method, the proximity exposure method is advantageous because the mask and substrate do not have direct contact which avoids the occurrence of rejects due to peeled-off photo resist-layers.

A prior art proximity exposure apparatus comprises, as shown in FIG. 4, a mercury lamp 51 as the light source wherein the light from mercury lamp 51 is condensed by a condensing mirror 52. The light path of the condensed light is bent by a cold mirror 53, and integrated by a fly-eye lens 54 and an aspherical mirror 55. Through the integration, the light is converted into light flux 56 having homogeneous distribution of light intensity for spot-illuminating a specified size. The light flux 56 is projected on a local space of an exposure surface 58 of substrate 57 through a mask 59. While the light is being projected on a local space, relative positioning between the lighting system and the exposure surface 58/mask 59 is shifted to perform the scanning exposure. Thus, a specified area is exposed and a mask pattern is transcribed on exposure surface 58 of substrate 57.

The degree of resolution in such proximity exposure apparatus depends on a gap 60 between exposure surface 58 and mask 59. The smallest possible line width ds is represented by a formula:

$$ds = \sqrt{(2\lambda G)}$$

where
ds: the smallest resolution line width,
λ: wave length of the light source,
G: distance of gap 60 between mask 59 and exposure surface 58.

If a resolution line width of approximately 3 μm, which is the width generally needed for the manufacture of a liquid crystal display device, etc. using a mercury lamp 51 as the light source, is to be provided, then the gap 60 between mask 59 and exposure surface 58 has to be approximately 10 μm.

However, even in normal cases, the exposure surface 58 of substrate 57 has an undulation of about 10–20 μm. To cope with this situation, in the exposure apparatus of FIG. 4, substrate 57 held on a flattening chuck 61 is transferred to a height measurement station(not shown) next to an exposure station shown in FIG. 4 to have the height of exposure surface 58 of substrate 57 measured. Based on the measurement results, an up/down member 62 within flattening chuck 61 is controlled to make the exposure surface 58 flat. Through these actions, the gap distance 60 between exposure surface 58 and mask 59 is maintained uniform, and then by adjusting a Z stage 63, the gap 60 is set to provide a required distance of approximately 10 μm. Then, substrate 57 is transferred to the exposure station for the scanning exposure.

The scanning exposure method does not require the large diameter condenser lens which is indispensable to a one-shot whole area exposure method. Thus, the scanning exposure method can be conducted with cheaper equipment, and furthermore the magnification compensation is easier with the scanning exposure method.

In a prior art constitution, however, the lighting assembly still remains expensive because fly-eye lens 54 and aspherical mirror 55 are used to integrate the light from mercury lamp 51 into light flux 56 for spot-illuminating a specified area for the scan-exposure; these components are costly because of the special shape and the high finishing accuracy required. In addition, the light path length of the integration system comprising of fly-eye lens 54 and aspherical mirror 55 of the lighting assembly tends to be relatively long, which makes the size of the entire lighting assembly large. If the size of the lighting assembly is to be made smaller, then the fly-eye lens 54 has to be made smaller which then makes the fly-eye lens 54 too fine to be practical.

A lighting assembly that solves these drawbacks has been longed for and until now such an assembly has never been implemented.

After having repeatedly conducted diverse experiments repeatedly, inventors of the present invention have found out that a small and simple optical component is capable of performing the required integration while making the lighting assembly compact.

SUMMARY OF THE INVENTION

The present invention aims to realize a lighting assembly that is small and inexpensive, yet capable of spot-illuminating a specified area with light flux having sufficiently homogeneous light intensity distribution; and an exposure apparatus and a method employing the lighting assembly.

A lighting assembly according to the present invention comprises a light source; a condensing-reflecting member for condensing the light from the light source; an optical integrator which receives at its one end the light from the condensing-reflecting member, and emits the light from the other end after making the light intensity distribution homogeneous; and a projection lens system for projecting the emitting surface of the optical integrator to an emitted surface.

In the optical integrator of the above described constitution, the light received from one end is integrated by repeating various reflections through the inner surfaces before it is emitted from the other end as light flux having homogeneous light intensity distribution over the entire emitting surface of the optical integrator. Thus, only one small and simple optical component converts the light into light flux suitable for spot illumination. A projection lens system then projects the emitting surface of the optical integrator to an emitted surface in an ultimately necessary area. Through such a simple process, a required high-precision local illumination is implemented, making it possible to reduce the size and the cost of an apparatus without sacrificing the level of performance.

An exposure apparatus according to the present invention comprises the lighting assembly, a transfer means for shifting the relative positioning between the lighting assembly and the substrate with an emitted surface, and an adjusting means for adjusting the distance between the substrate and a mask for forming a specific pattern.

The above described constitution enables one to illuminate a local space of the exposure surface, via a mask, with a homogeneous light flux derived from the lighting assembly for spot-illuminating a specific size. By shifting the relative positioning of the lighting assembly and the substrate, the homogeneous local illumination scans a specified area of the exposure surface on the substrate to have the whole specified area exposed. Therefore, however large the exposure surface may be, the entire area can be exposed uniformly by the homogeneous illumination, and a desired mask pattern can be transcribed with high precision. Also, because the lighting assembly is compact in size, the supporting structure and the driving mechanism for the scanning exposure can be made compact. The problem of a lighting assembly substantially expanding beyond the neighborhood of an exposure surface of a substrate is solved and the size of the whole apparatus is made compact and inexpensive.

DESCRIPTION OF THE PREFERRED EMBODIMENTS

In the following, description is made to a lighting assembly according to an embodiment of the present invention and an exposure apparatus employing the lighting assembly.

Figure 1:
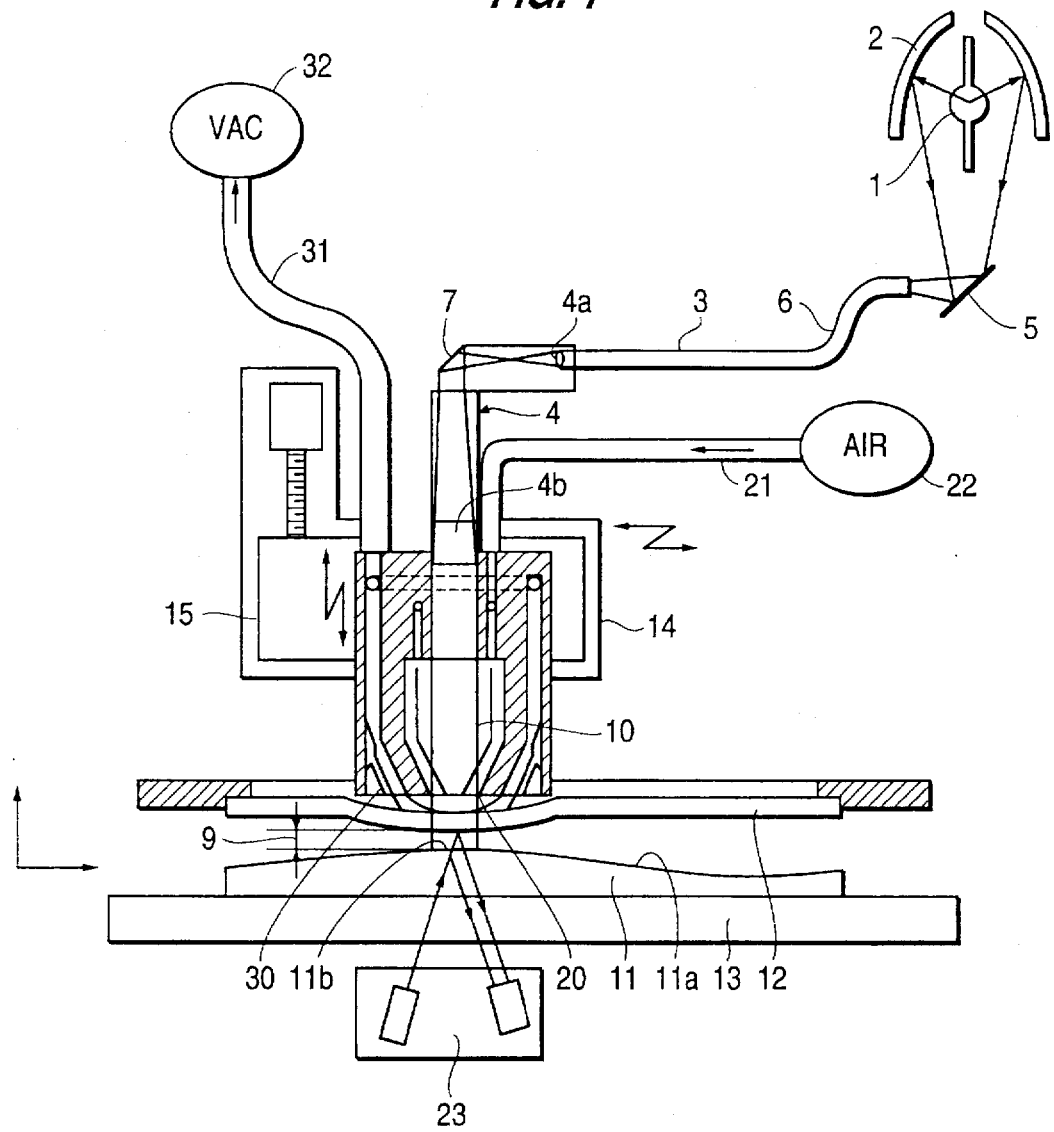
FIG. 1 shows a conceptual structure of a lighting assembly and an exposure apparatus employing the lighting assembly, as an embodiment of the present invention.

As shown in FIG. 1, the lighting assembly comprises an ellipsoidal mirror 2, or a condensing-reflecting member for condensing the light from a light source; a mercury lamp 1; an optical integrator 3 for integrating the light arriving at one end via ellipsoidal mirror 2 and emitting from the other end after making the light intensity distribution homogeneous; and a projection lens system 4 for projecting the emitting surface of the optical integrator 3 onto an emitted surface in a specific size. Although a mercury lamp 1 is used as the light source in FIG. 1, laser or other light sources other than a mercury lamp may of course be used depending on the application or various other conditions.

The optical integrator 3 is a quartz rod the cross section of which is a regular square; dimensions are 6 mm×6 mm cross section, and 150 mm in length. The preferred cross sectional shape of optical integrator 3 for obtaining homogeneous light intensity distribution is a triangle and polygon whose number of sides is an even-number; the most preferred shapes are regular square and hexagon.

The preferred dimensions of the rod are that the ratio of the overall length to the largest distances such between the facing sides of the cross section falls within a range between 2 to 50. As a practical example, when the cross section is 6 mm×6 mm, the overall length should preferably be within a range from 12 mm to 300 mm. If the rod length is too short, it is difficult to obtain a sufficiently homogeneous light intensity distribution; if too long, it is difficult to hold the optical integrator 3 within the lighting assembly. As to the material of the optical integrator 3, if the light source is a mercury lamp, quartz is preferred; if the light source is a laser, glass also becomes usable. As to the shape of the optical integrator 3, it is not limited to a solid rod, it may be, for example, a tube, the cross sectional inner wall of which has a polygon shape and has an inner wall surface which is light reflective.

The light from mercury lamp 1 is received by optical integrator 3 at its one end via a cold mirror 5 and an optical fiber 6 and is then emitted from the other end of optical integrators. As the optical integrator 3 is a square pillar, the incoming light flux of a specific radiation angle is repeatedly reflected to be integrated while proceeding through the optical integrator 3, while a plurality of apparent images of the light source are formed in a plane perpendicular to the optical axis. At the emitting surface of optical integrator 3, light fluxes which appear to have been emitted from a plurality of the apparent light source images are overlayed. Thus the light received is made to have a homogeneous light intensity distribution and is then emitted.

The largest number of reflections made within the optical integrator and the number of light source images thus created depend on the radiation angle of incoming light flux to the optical integrator 3 and the length/breadth of the optical integrator 3. Therefore, as described earlier, the ratio between the overall length and the largest distance between the facing sides in cross sectional shape of the optical integrator has to be optimized.

If the reflecting surfaces forming the optical integrator 3 are plane surfaces and the facing planes are parallel to each other, then the absolute value of each light angle relative to the optical axis, when the light flux is input into the optical integrator 3, is kept unchanged even after going through the optical integrator 3. Therefore, the intensity distribution of light flux 10 emitted by projection lens system 4 is dependant upon the angle and is almost similar to that of light flux input into the optical integrator 3. If the intensity distribution of light flux 10 is dependent on the angle, then the resolving power of an exposure apparatus employing the lighting assembly is sometimes ill affected. In such a case, it is effective to dispose an angle distribution smoothing means for reducing the dependence on the angle of the light intensity distribution input into the optical integrator 3. A transmitting surface or a reflection surface having unevenness in its surface may serve as the angle distribution smoothing means. A sheet, for example, having an uneven surface may be disposed just before optical integrator 3 so that the light can go through it. An optical fiber 6 may also be used as a smoothing means wherein the light proceeds inside of optical fiber 6, repeating reflections and using the natural curvature of optical fiber 6 as the uneven surface.

Figure 3:
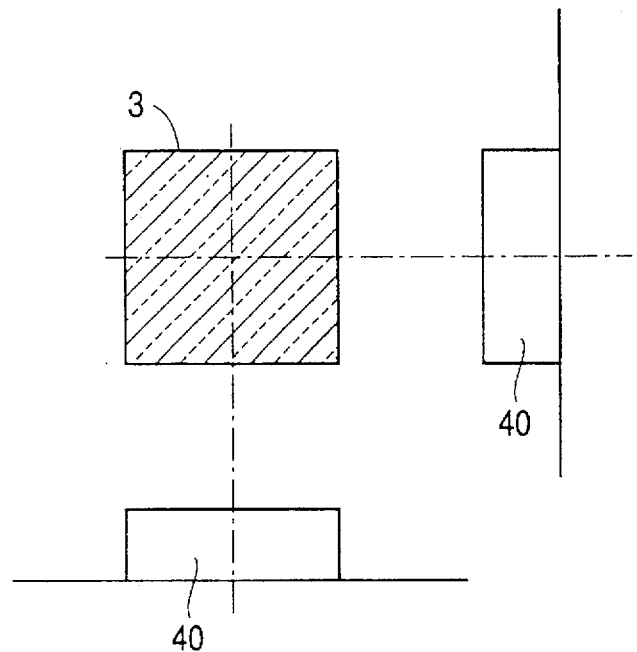
FIG. 3 is a chart showing the light intensity distribution in a cross section of the optical integrator of FIG. 1.
Figure 4:
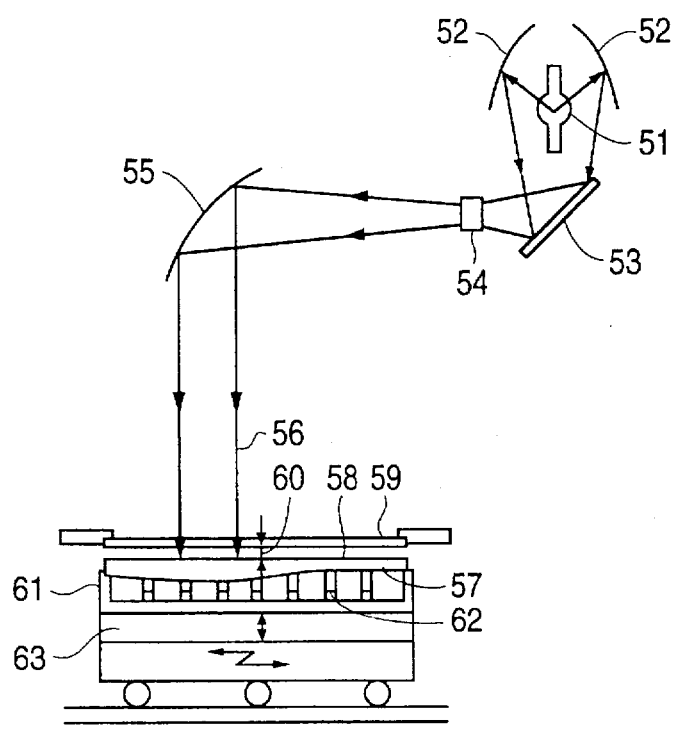
FIG. 4 shows a conceptual structure of a prior art lighting assembly and an exposure apparatus employing the lighting assembly.

By the above described integrating function, optical integrator 3 emits from its whole emitting area a light flux having a homogeneous light intensity distribution 40 as shown in experimental data of FIG. 3. In this-way, a light flux of a specific size suitable for uniform spot-illumination is obtainable by one small and simple optical component, the optical integrator 3. By simply projecting the light of the optical integrator 3 to the emitted surface in a necessary size through a projection lens system 4, a specific local lighting is implemented with high precision. This reduces the size and the cost of a lighting assembly without sacrificing the level of performance. Besides the proximity exposure, the present lighting assembly is applicable to various local lighting applications.

Figure 2A:
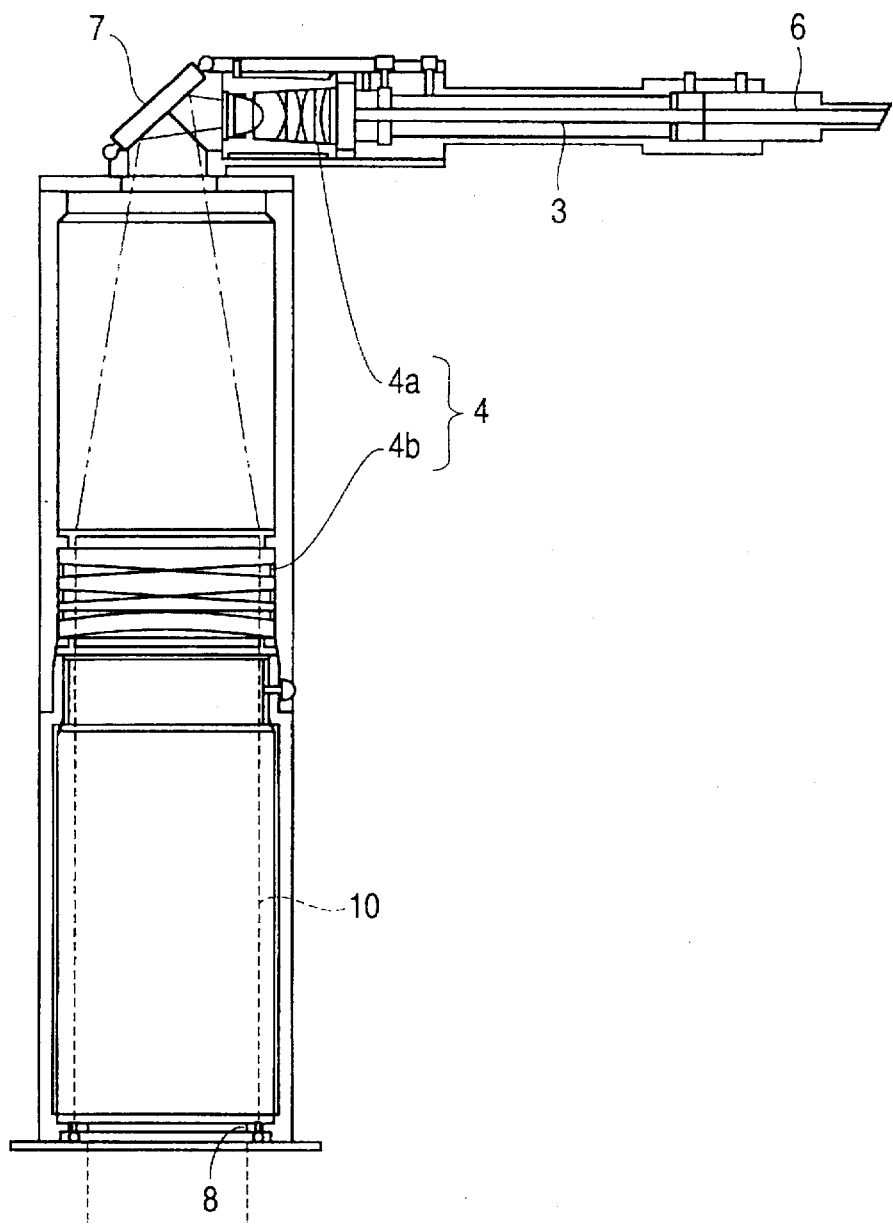
FIG. 2(a) shows a cross sectional front view of the optical integrator and projection lens system of exposure apparatus of FIG. 1.
Figure 2B:
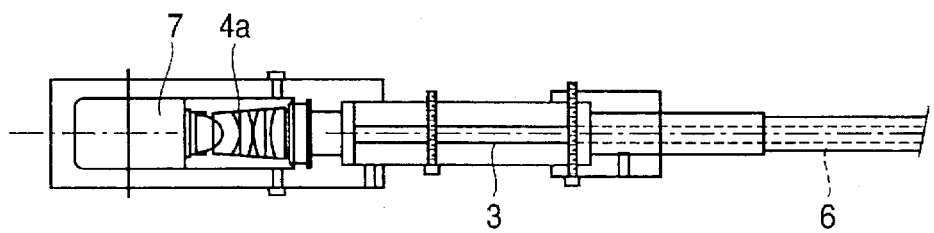
FIG. 2(b) shows a cross sectional top view.

In this embodiment, the light condensed by ellipsoidal mirror 2 is brought to one end of optical integrator 3 by means of a cold mirror 5 and an optical fiber 6. Projection lens system 4 is constituted by a projection system comprising two groups of lenses, lens group 4a and lens group 4b, as illustrated in FIG. 1, FIG. 2(a) and FIG. 2(b). Between the two lens groups, a reflection mirror 7 is disposed to bend the light path in a right angle. Cold mirror 5, optical fiber 6 and reflection mirror 7 may be omitted, or substituted with some others. However, such components as cold mirror 5, optical fiber 6 and reflection mirror 7 are effective in keeping a light path free from interference by others components and in disposing of a number of required components concentrated within a specific space. Therefore, it is convenient and effective to select and use some of these components.

At the exit of light flux 10 in projection lens system 4 is an aperture 8 which is used to trim the light flux to a predetermined shape and size. The aperture may be provided whenever necessary.

Now in the following, description is made of an exposure apparatus employing the lighting assembly. In an exposure apparatus illustrated in FIG. 1, there is a glass substrate 11 having an exposure surface 11a coated with photo resist. The exposure surface 11a is exposed by means of the proximity exposure via a mask 12 to a desired pattern disposed very close to the exposure surface to have the mask pattern transcribed on the photo resist of exposure surface 11a. In the present exposure apparatus, the lighting assembly illuminates a local space 11b of exposure surface 11a via mask 12. By shifting the relative positioning between the lighting assembly and the exposure surface 11a or mask 12, a specified area of exposure surface 11a is scanned and exposed, and the mask pattern is transcribed on exposure surface 11a.

In order to enable the shifting of relative positioning, the lighting assembly and the substrate 11 are supported separately by independent holding mechanisms. Namely, the lighting assembly is supported by a holding mechanism comprising a Y stage (not shown) movable in the Y direction, an X stage 14 movable in the X direction provided on the Y stage, and a Z stage 15 movable in the Z direction provided on the X stage 14. Whereas, the substrate 11 is supported by a holding mechanism comprising an X-Y-Θ stage(not shown) movable in two directions, X and Y, and a Z stage (not shown) movable in the Z direction provided on the former stage, via a quartz chuck 13.

The above described constitution allows for the position aligning of each part for exposure including the adjustment of gap 9 between exposure surface 11a of substrate 11 and mask 12 and the scanning for exposure. The scanning is performed intermittently so as to provide a sufficient exposure time needed for each of the local spaces 11b. By moving the X stage 14 and the Y stage, the lighting assembly is shifted to cover the whole part of a specific area for exposure and the exposure by scanning is performed. Meanwhile, the X-Y-Θ stage is moved on a small scale in the same direction as the scanning direction synchronized with the scanning of the lighting assembly for the purpose of distributing the errors. The mask pattern is then transcribed on substrate 11 with the magnification compensation.

The gap 9 is adjusted for each of the local spaces 11b to be exposed, thereby taking advantage of the intermittent scanning action of the lighting assembly described below. The exit for light flux 10, located at the aperture 8 of the lighting assembly, has a nozzle shape 20 as illustrated in FIG. 1. At the nozzle 20, compressed air supplied from an air source 22 blows out through air piping 21. Mask 12 is locally deformed by the air. Representing the pressure at the nozzle exit with $P$, and the cross sectional area with $S$: the force $F$ given to mask 12 is, $F=P \times S$. In a case, for example, where a mask of 360 mm×465 mm and 4 mm thick, and a nozzle 20 of 4 cm$^2$ cross sectional area are used, the pressure $P$ needed to bend the mask 12 by several tens of μm is hundreds of g/cm$^2$. Pressure P at the nozzle exit is dependent on the distance between the head of nozzle 20 and the upper surface of mask 12. The pressure P increases when the lighting assembly is lowered and the amount of deformation of mask 12 increases.

The distance of gap 9 between the exposure surface 11a of substrate 11 and the mask 12 is measured by means of a laser reflection type gap measurement means 23. Based on an output signal of the measurement result and the gap signal set by a setting device(not shown), the Z stage 15 is shifted by a distance corresponding to the differential signal. Through this process the gap 9 is always kept at a specified distance and the exposure by scanning is performed with high resolution over the entire area.

As described above, according to the present embodiment a large area of exposure surface 11a can be uniformly exposed with homogeneous illumination, and a mask pattern can be transcribed an exposure surface with high precision. Furthermore, as the lighting assembly is compact-sized, the scanning exposure can be performed by moving the structure of the lighting assembly. Therefore, the supporting mechanisms and the driving devices for scanning exposure are made smaller, and the problem that the lighting assembly is substantially larger than the neighborhood of exposure surface 11a is also solved. Thus the whole appliance is made smaller and inexpensive.

The present embodiment further comprises a port formed around nozzle 20 of the lighting assembly, and a suction port 30 connected through a vacuum piping 31 with a vacuum source 32. By making use of the suction port 30, a zone surrounding a local area of mask 12 on which light flux is illuminating can be lifted up with a negative pressure, i.e., creating a suction pressure. Therefore, the mask 12 is deformed in a more localized space, rendering it possible to place mask 12 closer to the exposure surface 11a. This embodiment provides for an exposure by scanning with a higher resolution which can be used dependent on the particular need.

What is claimed is:

1. A lighting assembly for projecting an image onto a surface of a substrate, said lighting assembly comprising:
   a light source;
   a condensing-reflecting member for condensing light from said light source;
   an optical integrator, having a receiving end and an emitting end, for receiving light from said light source, causing the light to attain a homogeneous light intensity distribution, and emitting the homogeneously distributed light from said emitting end;
   a projection lens system, having a receiving end and a projecting end, for receiving the homogeneously distributed light emitted by said optical integrator, and projecting the homogeneously distributed light from said projecting end; and
   an image transcribing mask disposed adjacent said projecting end of said projection lens system.

2. A lighting assembly, as claimed in claim 1, wherein said optical integrator is comprised of a rod having a length and a polygon shaped cross-section having an even number of sides.

3. A lighting assembly, as claimed in claim 2, wherein dimensions of said rod are such that a ratio of said length to a maximum cross-sectional dimension of said polygon shaped cross-section is between a range from 2 to 50.

4. A lighting assembly, as claimed in claim 1, wherein said light source is comprised of a mercury lamp and said optical integrator is comprised of a quartz material.

5. A lighting assembly, as claimed in claim 1, wherein said projection lens system is comprised of a first lens group and a second lens group.

6. A lighting assembly, as claimed in claim 1, wherein said projection lens system further includes a trimming aperture for trimming the light to form a spot light having a predetermined form and dimension;

said trimming aperture being disposed at said projecting end of said projection lens system.

7. A lighting assembly, as claimed in claim 1, further comprising a cold mirror for reflecting the light from said condensing-reflecting member into said receiving end of said optical integrator.

8. A lighting assembly, as claimed in claim 1, further comprising an optical fiber disposed between said light source and said receiving end of said optical integrator.

9. A lighting assembly, as claimed in claim 1, further comprising an angle distribution smoothing means, disposed between said light source and said receiving end of said optical integrator, for reducing angle fluctuations of the light entering said receiving end of said optical integrator.

10. An exposure apparatus, for exposing an image onto a surface of a substrate, said exposing apparatus comprising:

a lighting assembly;

a substrate retaining device;

a transfer means for adjusting a position of said lighting assembly relative to the substrate retaining device;

wherein said lighting assembly comprises a light source; a condensing-reflecting member for condensing light from said light source; an optical integrator, having a receiving end and an emitting end, for receiving light from said light source, causing the light to attain a homogeneous light intensity distribution, and emitting the homogeneously distributed light from said emitting end; a projection lens system, having a receiving end and a projecting end, for receiving the homogeneously distributed light emitted by said optical integrator, and projecting the homogeneously distributed light from said projecting end; and an image transcribing mask disposed adjacent said projecting end of said projection lens system; and an adjusting means for adjusting a position of the image transcribing mask relative to the substrate retaining device.

11. The exposure apparatus, as claimed in claim 10, wherein said adjusting means comprises a mask deforming means for deforming the image transcribing mask at a specified area thereof; and said mask deforming means is disposed at a location adjacent said projecting end of said projection lens system.

12. The exposure apparatus, as claimed in claim 11, wherein said mask deforming means includes an air blowing nozzle.

13. The exposure apparatus, as claimed in claim 12, wherein said air blowing nozzle is operable to blow air against said specified area of said image transcribing mask to thereby deform said specified area of said image transcribing mask toward said substrate retaining device.

14. The exposure apparatus, as claimed in claim 12, wherein said mask deforming means includes a suction port.

15. The exposure apparatus, as claimed in claim 14, wherein said suction port is operable to create a suction pressure at said specified area of said image transcribing mask to thereby deform said specified area of said image transcribing mask away from said substrate retaining device.

16. The exposure apparatus, as claimed in claim 11, wherein said mask deforming means includes a suction port.

17. The exposure apparatus, as claimed in claim 16, wherein said suction port is operable to create a suction pressure at said specified area of said image transcribing mask to thereby deform said specified area of said image transcribing mask away from said substrate retaining device.

18. An exposure method, for exposing an image onto a surface of a substrate, said exposure method comprising:

providing a lighting assembly comprising a light source; a condensing-reflecting member for condensing light from said light source; an optical integrator, having a receiving end and an emitting end, for receiving light from said light source, causing the light to attain a homogeneous light intensity distribution, and emitting the homogeneously distributed light from said emitting end; a projection lens system, having a receiving end and a projecting end, for receiving the homogeneously distributed light emitted by said optical integrator, and projecting the homogeneously distributed light from said projecting end; and an image transcribing mask disposed adjacent said projecting end of said projection lens system;

exposing the surface of the substrate to the homogeneously distributed light projected from said projecting end of said projection lens system via the image transcribing mask; and scanning the surface of the substrate with the homogeneously distributed light by adjusting a position of the lighting assembly relative to the substrate.

19. An exposure method, as claimed in claim 18, further comprising adjusting a position of the image transcribing mask relative to the substrate.

20. An exposure method, as claimed in claim 19, wherein said adjusting of a position of the image transcribing mask relative to the substrate is performed by deforming the image transcribing mask at a specified area thereof by blowing compressed air toward said specified area of the image transcribing mask.

21. An exposure method, as claimed in claim 19, wherein said adjusting of a position of the image transcribing mask relative to the substrate is performed by deforming the image transcribing mask at a specified area by creating a suction at said specified area of the image transcribing mask.

* * * * *